(12) United States Patent
Dalla Piazza et al.

(10) Patent No.: US 7,412,886 B2
(45) Date of Patent: Aug. 19, 2008

(54) ANGULAR SPEED MEASURING TRANSDUCER

(75) Inventors: Silvio Dalla Piazza, St-Imier (CH); Bruno Studer, Riedholz (CH)

(73) Assignee: ETA SA Manufacture Horlogere Suisse, Grenchen/Granges (CH)

( * ) Notice: Subject to any disclaimer, the term of this patent is extended or adjusted under 35 U.S.C. 154(b) by 337 days.

(21) Appl. No.: 11/300,482

(22) Filed: Dec. 15, 2005

(65) Prior Publication Data
US 2006/0130578 A1    Jun. 22, 2006

(30) Foreign Application Priority Data
Dec. 20, 2004    (EP)    ................... 04106714

(51) Int. Cl.
*G01P 9/04*    (2006.01)
(52) U.S. Cl. .................... 73/504.16; 310/370
(58) Field of Classification Search ............. 73/504.16, 73/504.14; 331/156; 310/370; 333/200
See application file for complete search history.

(56) References Cited
U.S. PATENT DOCUMENTS

| | | | | |
|---|---|---|---|---|
| 4,930,351 A | * | 6/1990 | Macy et al. | 73/504.04 |
| 5,736,640 A | * | 4/1998 | Farine et al. | 73/504.12 |
| 6,484,576 B2 | * | 11/2002 | Yachi et al. | 73/504.16 |
| 6,532,817 B1 | * | 3/2003 | Yukawa et al. | 73/504.16 |
| 6,894,428 B2 | * | 5/2005 | Tanaya et al. | 310/370 |
| 7,112,915 B2 | * | 9/2006 | Tanaya et al. | 310/370 |
| 7,122,945 B2 | * | 10/2006 | Satoh et al. | 310/370 |
| 7,168,319 B2 | * | 1/2007 | Dalla Piazza et al. | 73/504.16 |

FOREIGN PATENT DOCUMENTS

| | | |
|---|---|---|
| EP | 494 588 A1 | 7/1992 |
| EP | 750 177 A1 | 12/1996 |

\* cited by examiner

*Primary Examiner*—Hezron E. Williams
*Assistant Examiner*—Mark Shabman
(74) *Attorney, Agent, or Firm*—Sughrue Mion, PLLC

(57) ABSTRACT

A transducer for measuring an angular velocity formed by a single piezoelectric tuning fork (21) that rotates at the angular velocity. The tuning fork has a detection leg (24) which has a cross-shaped section including two top lateral faces (33, 34) and two bottom lateral faces (37, 38) separated by protruding parts (41, 42) projecting with respect to the faces. The detection leg has detecting electrodes which are arranged such that the electrical field between electrodes is substantially rectilinear through the detection leg.

8 Claims, 4 Drawing Sheets

Cut I-I

Cut II-II

ANGULAR SPEED MEASURING TRANSDUCER

FIELD OF THE INVENTION

The present invention concerns, generally, a transducer for measuring an angular velocity, formed by a single piezoelectric tuning fork that rotates at said angular velocity comprising a base from which an excitation leg and a detection leg extend, and it concerns more specifically the arrangement of the detection electrodes arranged on the detection leg.

BACKGROUND OF THE INVENTION

There is known from the prior art, particularly from EP Patent No. 0 750 177, a gyrometer formed by a single tuning fork having a base from which there extends a first leg on which excitation electrodes are arranged, and a second leg are which detection electrodes are arranged.

FIG. 1 shows an example tuning fork 1 of the type of those that can be used in a gyrometer. Tuning fork 1 shown in longitudinal cross-section in FIG. 1a mainly comprises a base 2 secured to two legs 3, 4, the assembly being made of a piezoelectric quartz material. As shown in transverse cross-section in FIG. 1b, each leg 3, 4 includes electrodes. Excitation leg 3 includes a first pair of excitation electrodes 5a, 5b connected to each other and to which an alternating electric signal is applied at the resonant frequency of the tuning fork in its main plane corresponding to that of FIG. 1a, and a second pair of excitation electrodes 6a, 6b connected to each other and to which an alternating electric signal is applied in phase opposition to that applied to electrodes 5a and 5b. The application of these alternating electric signals excites and consequently causes legs 3 and 4 of tuning fork 1 to vibrate mechanically in a first plane, as indicated by arrows 9. Detection leg 4 includes a first pair of detection electrodes 7a, 7b connected to each other and a second pair of detection electrodes 8a, 8b connected to each other, such pairs converting the mechanical vibrations of the detection leg into an electric signal detected by means of a detection circuit to which said electrodes are connected.

According to tuning fork gyrometer theory, while an excitation signal is being applied to excitation electrodes 5a-5b, 6a-6b, an angular rotational movement of tuning fork 1 about its longitudinal axis 10 generates a Coriolis force perpendicular to the velocity of the excited leg and to rotational axis 10, and consequently, a vibration in detection leg 4 in a perpendicular plane to the excitation vibration plane, as indicated by arrows 11. This mechanical vibration is converted by the piezoelectric quartz of tuning fork 1 into an electric signal which is detected by the tuning fork detection electrodes 7a-7b, 8a-8b.

One of the main problems observed with this detection electrode arrangement lies in the fact that the electrical path of the field to be detected between two detection electrodes to which an opposite electrical signal is applied, is not rectilinear, and consequently a non-negligible part of the field lines is lost. Consequently, the detection measurement is not optimal.

A theoretically interesting solution would consist in arranging the two pairs of detection electrodes 7a-7b, 8a-8b, as is shown in FIG. 1c. However, this solution has a major drawback, insofar as it requires implementation of a complex manufacturing method that is difficult to control. Indeed, the electrodes present on the lateral faces of the tuning fork are made by an "electrode deposition", which is necessarily carried out over the entire thickness of the lateral face. Thus, it is then very difficult to separate, the electrode deposition in two, in order to obtain the two desired distinct electrodes 7b, 8b. Moreover, this type of gyrometer is made in series, i.e. one beside the other. Thus, it is also very difficult to separate the electrode deposition made on the external lateral faces of the tuning fork into two distinct electrodes 7a, 8b.

Moreover, the various aforementioned solutions have an additional drawback, namely the size of the tuning fork, which for such on board gyrometer applications must of course advantageously be as miniature as possible.

SUMMARY OF THE INVENTION

It is one of the main objects of the present invention to overcome the aforementioned drawbacks by making a transducer for measuring an angular velocity in the form of a piezoelectric resonator with a tuning fork having a detection electrode structure that ensures an optimised measurement of the electrical field created in the detection leg while using a manufacturing method that is simple to implement.

Thus, within the scope of the present invention, the detection electrodes are arranged such that, on the one hand, the manufacturing method thereof is simple and that, on the other hand, the electrical field lines detected in the detection leg travel along a substantially rectilinear electrical path between the opposite electrodes through the detection leg. For this purpose, protruding parts are provided on the lateral faces of the detection leg of the tuning fork, so that the detection electrodes arranged on the top part can be easily separated from those arranged on the bottom part of the leg.

Thus, according to a preferred embodiment, the invention concerns a transducer for measuring an angular velocity in accordance with the preamble of the description characterized in that the detection leg has a cross-shaped section including two top lateral faces and two bottom lateral faces, the top and bottom faces being separated by protruding parts projecting with respect to the top and bottom faces and in that the detection means include first and second detection electrodes arranged facing each other, each being arranged on one of the top lateral faces such that the electrical field between the first and second detection electrodes is substantially rectilinear through the detection leg, and third and fourth detection electrodes arranged facing each other, each being arranged on one of the bottom lateral faces such that the electrical field between the third and fourth detection electrodes is substantially rectilinear through the detection leg.

Again, for the sake of miniaturisation, mechanical uncoupling means are advantageously provided at the base of the tuning fork, thus further reducing the size of the latter.

BRIEF DESCRIPTION OF THE DRAWINGS

Other features and advantages of the present invention will appear more clearly upon reading the following detailed description of embodiments of the invention, given solely by way of non-limiting example and illustrated by the annexed drawings, in which:

FIG. 1b, already described, is a transverse cross-section I-I of the excitation and detection legs of the tuning fork of FIG. 1a;

FIG. 2b is an enlarged transverse cross-section II-II of the excitation and detection legs of the tuning fork according to FIG. 2a;

FIG. 3a is an enlarged transverse cross-section of the excitation and detection legs of a tuning fork according to a second embodiment of the invention;

DETAILED DESCRIPTION OF THE INVENTION

Figure 1A:
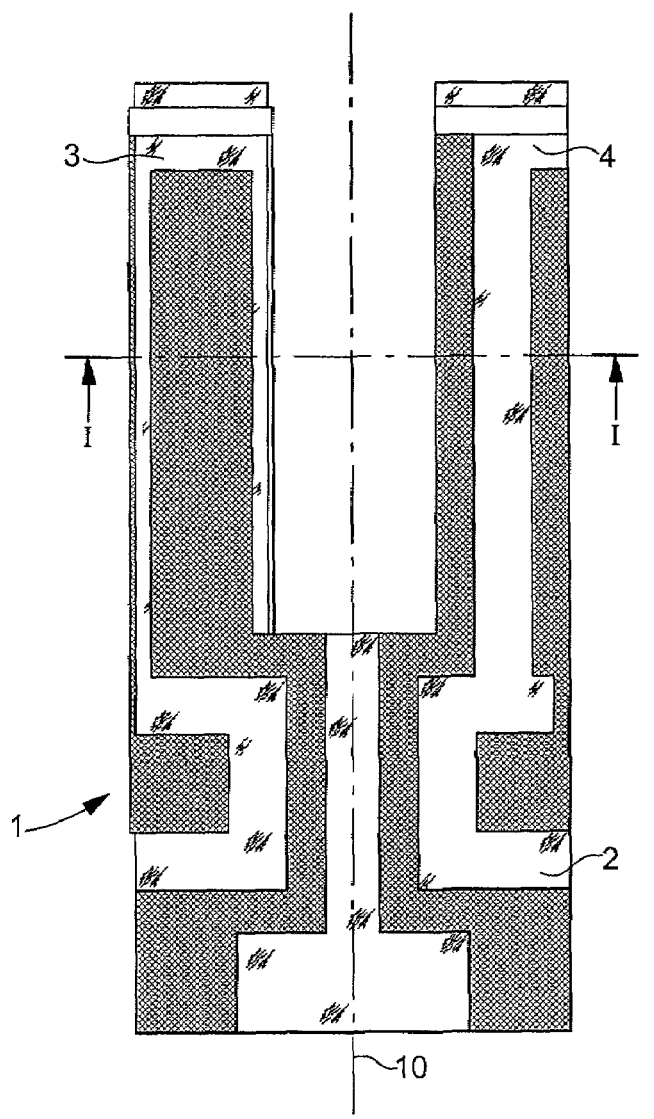
FIG. 1a, already described, is a longitudinal cross-section of a tuning fork like those used in certain gyrometers according to the prior art.
Figure 1B:
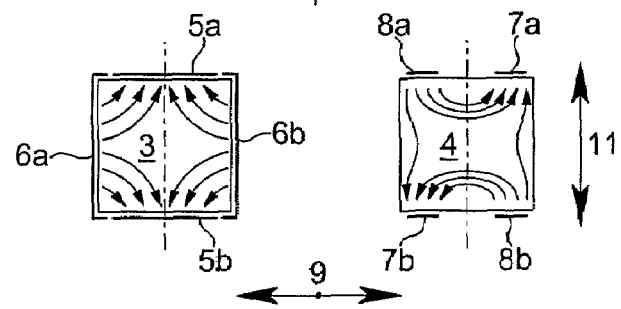
Figure 1C:
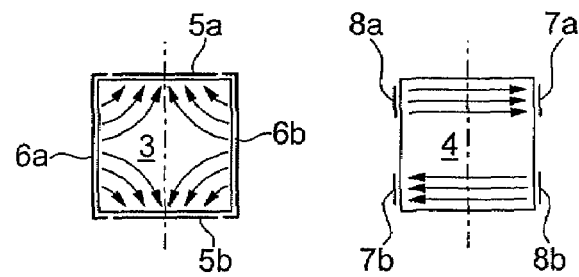
FIG. 1c, already described, is a transverse cross-section of the excitation and detection legs of a tuning fork with an optimised arrangement of the detection electrodes.
Figure 2A:
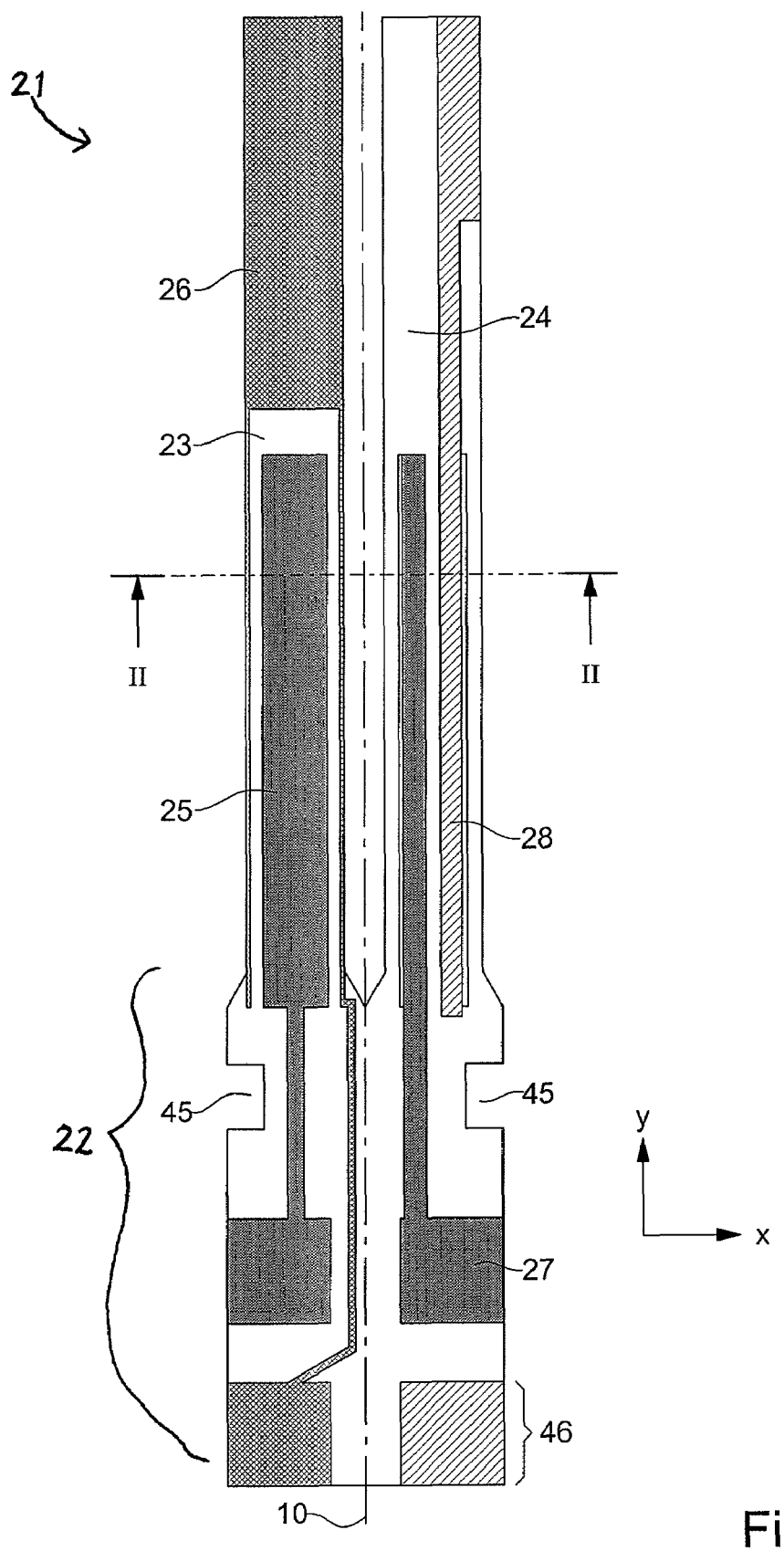
FIG. 2a is longitudinal cross-section of a tuning fork for a gyrometer according to a first embodiment of the invention.
Figure 2B:
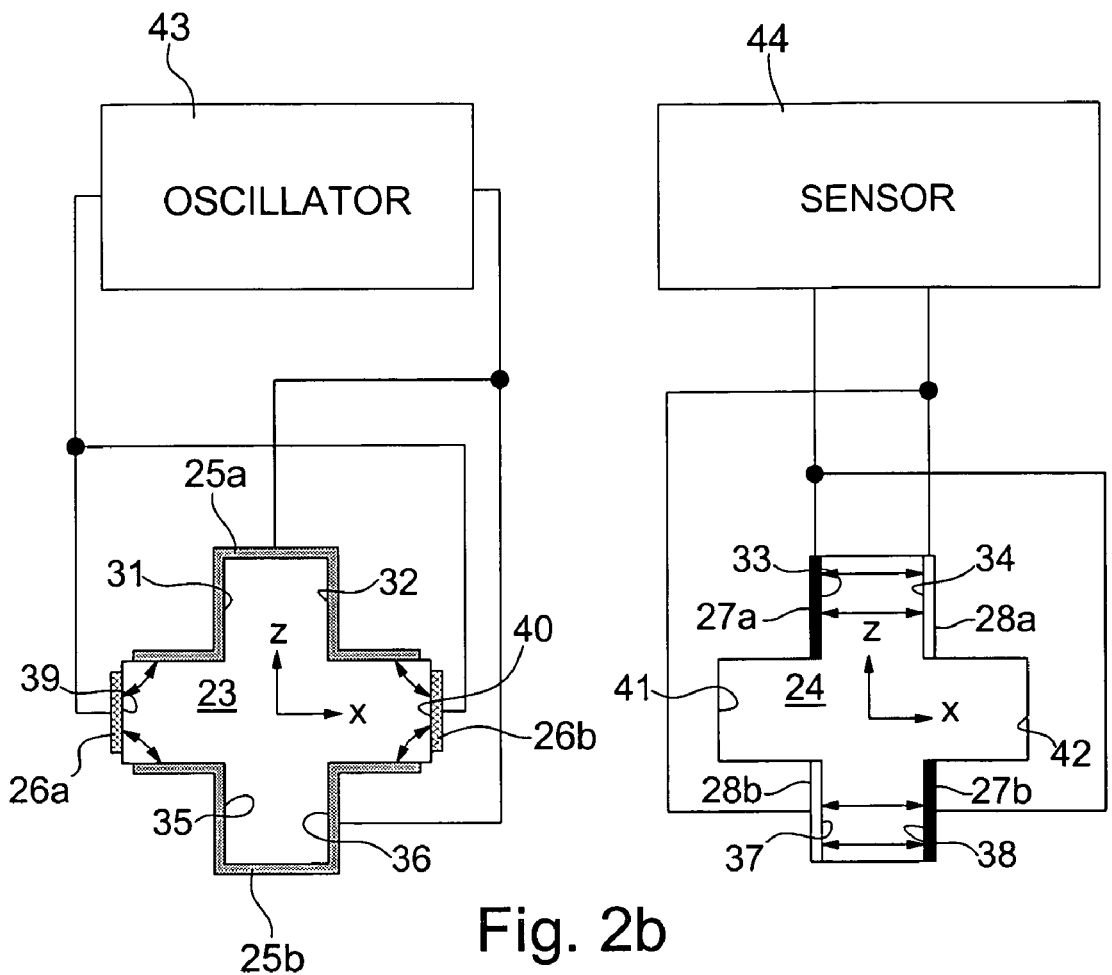

According to a first preferred embodiment of the invention shown in FIGS. 2a and 2b, the device for measuring an angular velocity includes a transducer formed by a single piezoelectric, conventionally quartz, tuning fork 21 that rotates at the angular velocity, formed by a base 22 from which two parallel legs 23, 24 extend, separated by a slot and which each carry conductive depositions forming electrodes of opposite polarity which create and detect an alternating electrical field in the legs, causing and caused by the vibration of the tuning fork by piezoelectric deformation.

Excitation means 25, 26 are arranged on one of the two legs, called the excitation leg 23, to generate, in response to an excitation signal, a vibration of the transducer at a determined frequency, preferably corresponding to the resonant frequency of the tuning fork in its X-Y plane, in a first direction. In accordance with the example shown in FIG. 2b, which is a transverse cross-section along the axis II-II of FIG. 2a, excitation leg 23 advantageously has a cross-shaped section, including two top lateral faces 31-32 and two bottom lateral faces 35-36, the top and bottom faces being separated by protruding parts 39-40 projecting, preferably substantially along axis x, with respect to the top and bottom lateral faces. According to this first embodiment the excitation means include a first pair of excitation electrodes 25a and 25b arranged respectively on the top 31-32 and bottom 35-36 faces of the excitation leg and a second pair of excitation electrodes 26a and 26b, or lateral electrodes arranged over the entire thickness of protruding parts 39 and 40 respectively of the excitation leg.

The electrodes are provided to be electrically connected in a way that is in itself conventional, central electrodes 25a and 25b to one of the poles of the excitation source and lateral electrodes 26a and 26b to the opposite pole of the excitation source; these connections can largely be achieved by conductive paths deposited on the tuning fork itself. In the example of FIG. 2a, the excitation source has been shown in the form of an oscillator 43. During operation, the resonator vibrations can thus be maintained by bending excitation leg 23 of the turning fork, owing to a transverse alternating electrical field in the planes of legs 23, 24.

Detection means 27, 28 are provided on the other leg of the tuning fork, called the detection leg 24, to generate an electrical detection signal in response to a second vibration of the transducer, due to the first vibration and to the rotation about longitudinal axis 10, having the same determined frequency and in a second direction perpendicular to the first direction. The second vibration includes a useful component whose amplitude is representative of angular velocity.

The gyrometer comprising the tuning fork previously described further includes a suitable measuring apparatus, shown in the form of a receiver 44, which will not be described here since the structure thereof depends upon the purpose for which the angular velocity of the transducer is being measured, this measuring apparatus supplying, from the electrical detection signal, a measuring signal representative of angular velocity.

Again, in accordance with the example shown in FIG. 2b, detection leg 24 has a cross-shaped section, comprising two top lateral faces 33-34 and two bottom lateral faces 37-38, the top and bottom faces being separated by protruding parts 41-42 projecting, preferably substantially along the x axis, with respect to the top and bottom lateral faces.

The detection means include first 27a and second 28a detection electrodes arranged facing each other, on one top lateral face 33, and the other top lateral face 34, respectively, such that the electrical path between the two electrodes 27a and 28a is substantially rectilinear through detection leg 24. The detection means also comprise third 27b and fourth 28b detection electrodes arranged facing each other, on one bottom lateral face 37 and on the other bottom lateral face 38, respectively, such that the electrical path between the two electrodes 27b and 28b is substantially rectilinear through detection leg 24. Electrodes 27a and 27b are connected to a first pole of detector 44 and electrodes 28a and 28b are connected to a second pole of detector 44 opposite the first pole. Thus, detection of the electrical field generated in the detection leg is optimised while providing a simple electrode deposition method similar to that disclosed in EP Patent No. 0 750 177.

Again for the sake of miniaturisation, mechanical uncoupling means 45 are advantageously provided between the part 46 securing the base of the tuning fork to the gyrometer and vibrating legs 23, 24. These mechanical uncoupling means can, according to a first variant, be formed by notches 45 made in the top part of the base. According to a second variant, not shown here, these mechanical uncoupling means are formed by a hole arranged in the top central part of base 22. A combination of the aforementioned variants can also be envisaged It will be noted that in FIGS. 2c, 3a and 3b, the description of which will follow, oscillator 43 and detector 44 have not been shown again for the sake of simplification.

Figure 2C:
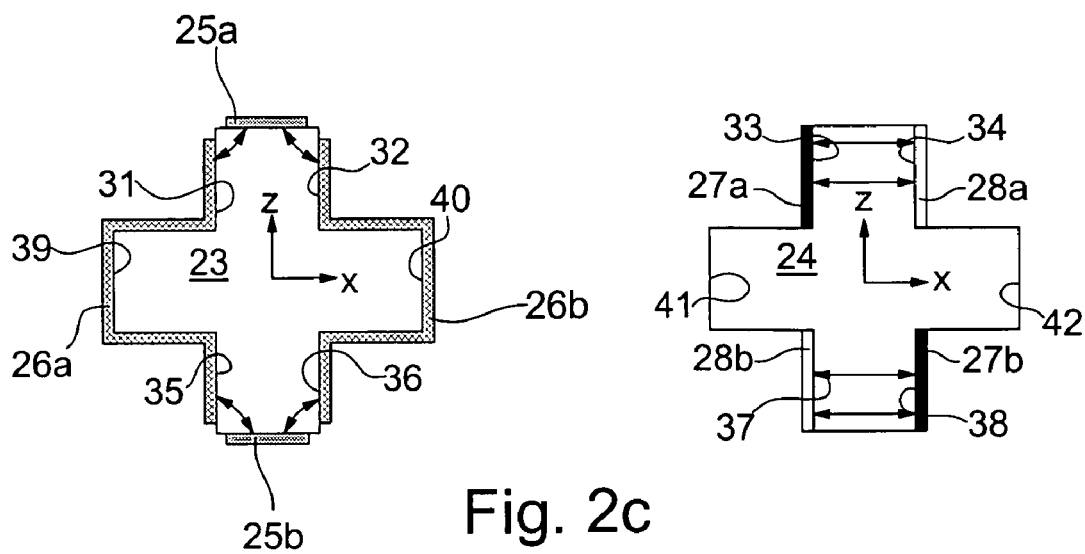
FIG. 2c is an enlarged transverse cross-section of the two legs of a tuning fork according to a variant of the first embodiment of the invention.

FIG. 2c shows a variant of the tuning fork described in relation to FIGS. 2a and 2b. This variant differs from the first embodiment in relation to the arrangement of the excitation electrodes on excitation leg 23.

According to this variant, alternatively the excitation means include a first pair of excitation electrodes 25a and 25b respectively arranged on the top and bottom of the excitation leg without covering the top lateral faces 31-32 and bottom lateral faces 35-36, and a second pair of electrodes or central electrodes 26a and 26b respectively or lateral electrodes, arranged over the entire thickness of protruding parts 39 and 40 respectively of the excitation leg and also at least partially covering the respective top and bottom lateral faces, 31 and 35, 32 and 36.

FIG. 3a shows a transverse cross-section of a tuning fork for a gyrometer according to a second embodiment of the invention. Excitation leg 23 and detection leg 24 each have a substantially cross-shaped section, comprising two top lateral faces 31-32 and 33-34 respectively and two bottom lateral faces 35-36 and 37-38 respectively, the top and bottom faces being separated by protruding parts 39-40 and 41-42 respectively projecting, preferably substantially along the x axis, with respect to the top and bottom lateral faces. Each of the two legs includes a top face 47 and 48 respectively, and a bottom face 49 and 50 respectively, preferably substantially in the X,Y plane.

In the example shown in FIG. 3a, excitation leg 23 includes two grooves 51-52 etched onto its top face 47 and two grooves 53-54 etched onto its bottom face 49. However, one could envisage, by way of alternative, providing only one groove on each of the top and bottom faces.

The excitation means include a first excitation electrode 25a arranged on top face 47, so as to cover grooves 51-52 transversely, and a second excitation electrode 25b arranged on bottom face 49, so as to cover grooves 53-54 transversely. The excitation means also include third 26a and fourth 26b excitation electrodes, or lateral electrodes connected to a potential opposite that to which the first electrodes 25a and 25b are connected, and arranged over the entire thickness of protruding parts 39 and 40 respectively of the excitation leg as well as at least partially covering the top 31 and 32 and bottom 35 and 36 lateral faces.

In the same way, detection leg 24 includes two grooves 55-56 etched on its top face 48 and two grooves 57-58 etched on its bottom face 50. Each of grooves 55-58 has lateral flanks. However, as for the excitation leg, one could envisage by way of alternative providing only one groove on each of the top and bottom faces. It will also be noted that providing grooves on both faces gives a symmetrical leg section, which prevents deformation of the legs outside the plane thereof. The presence of the grooves encourages the creation of a homogenous electrical field along the electrical axis X of the crystal.

Again according to FIG. 3a, the detection means include a first pair of detection electrodes 27a-28a arranged facing each other, electrode 28a being arranged on top lateral face 33, the other electrode 27a being arranged on one of the lateral flanks of groove 55, such that the electrical field between the two electrodes 27a and 28a is substantially rectilinear through leg 24, and a third pair of detection electrodes 27c-28c arranged facing each other, electrode 27c being arranged on the top lateral face 34 and the other electrode 28c being arranged on one of the lateral flanks of groove 56 such that the electrical field between the two electrodes 27c and 28c is substantially rectilinear through detection leg 24. In a symmetrical manner, the detection means include a second pair of detection electrodes 27b-28b arranged facing each other, electrode 28b being arranged on the bottom lateral face 38, the other electrode 27b being arranged on one of the lateral flanks of groove 58, such that the electrical field between the two electrodes 27b and 28b is substantially rectilinear through leg 24, and a fourth pair of detection electrodes 27d-28d arranged facing each other, electrode 27d being arranged on the bottom lateral face 37 and the other electrode 28d being arranged on one of the lateral flanks of groove 57 such that the electrical field between the two electrodes 27d and 28d is substantially rectilinear through detection leg 24.

According to this second embodiment, the depth of grooves 55-58 longitudinally etched onto each of the top and bottom faces of the excitation and detection legs, is comprised between 20% and 45% of the thickness of the legs, and preferably of the order of 30%.

The arrangement of the electrodes in grooves etched in the thickness of the legs increases the piezoelectric coupling. With equal dimensions, this increase leads to a decrease in the equivalent resistance of the tuning fork, and thus a decrease in the power consumption of the oscillator associated therewith, since with an equal quality factor, this arrangement enables the dimensions of the resonator to be reduced.

Figure 3B:
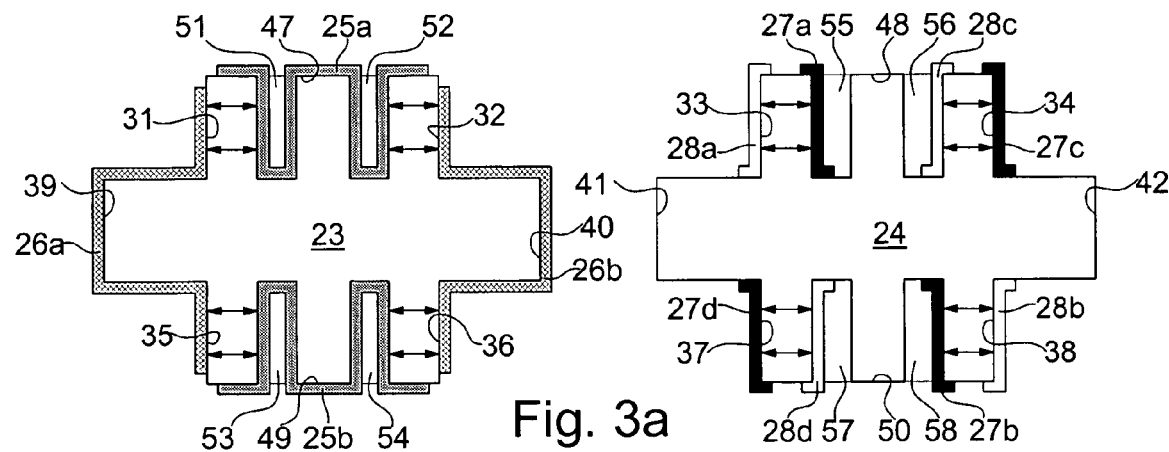
FIG. 3b is an enlarged transverse cross-section of the excitation and detection legs of a tuning fork according to a variant of the second embodiment of the invention.
Figure 3B:
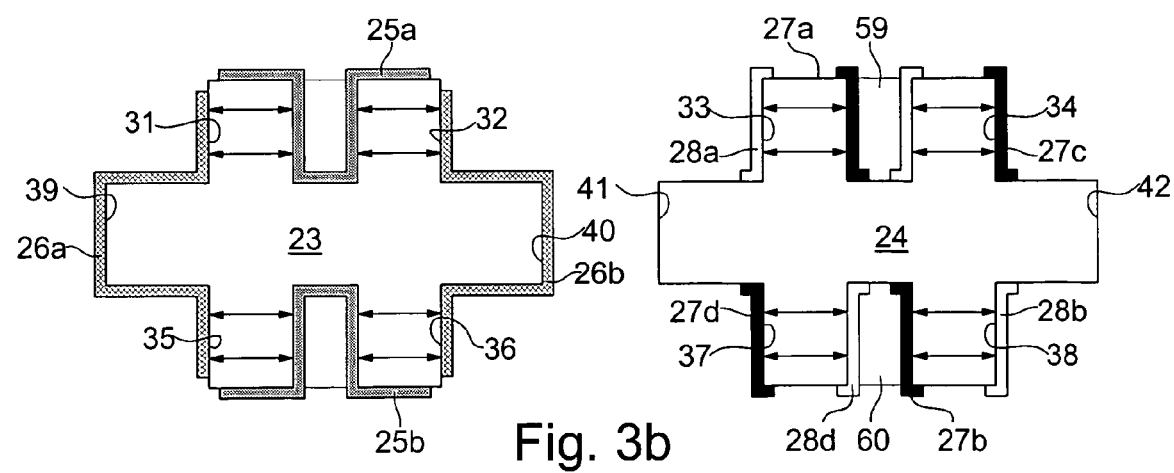

According to a variant of this second embodiment, shown in FIG. 3b, the excitation and detection legs have only one groove on each of the top and bottom faces. In this case, the excitation electrodes arranged on the top and bottom faces of the excitation leg transversely cover the corresponding groove. As regards the detection means, these include a first pair of detection electrodes 27a-28a, arranged facing each other, electrode 28a being arranged on the top lateral face 33 and the other electrode 27a being arranged on one of the lateral flanks of groove 59 such that the electrical field between the two electrodes 27a and 28a is substantially rectilinear through detection leg 24, and a third pair of detection electrodes 27c-28c arranged facing each other, electrode 27c being arranged on the top lateral face 34 and the other electrode 28c being arranged on the other lateral flank of groove 59 such that the electrical field between the two electrodes 27c and 28c is substantially rectilinear through detection leg 24. In a symmetrical manner, the detection means include a second pair of detection electrodes 27b-28b arranged facing each other, electrode 28b being arranged on the bottom lateral face 38, the other electrode 27b being arranged on one of the lateral flanks of groove 60, such that the electrical field between the two electrodes 27b and 28b is substantially rectilinear through leg 24, and a fourth pair of detection electrodes 27d-28d arranged facing each other, electrode 27d being arranged on the bottom lateral face 37 and the other electrode 28d being arranged on the other lateral flank of groove 60 such that the electrical field between the two electrodes 27d and 28d is substantially rectilinear through detection leg 24.

It will be noted that, advantageously, as is shown in FIGS. 2a, 2b and 3a and 3b, the piezoelectric tuning fork is a quartz whose main top and bottom faces are substantially perpendicular to the optical axis (z) of the quartz and in that the legs extend substantially along the mechanical axis (y) of the quartz.

It will be clear that various alterations and improvements obvious to those skilled in the art can be made to the various embodiments of the invention described in the present description, particularly it will be noted that the detection and excitation legs can be inverted, the excitation leg then being used as detection leg, and vice versa, that the mechanical uncoupling means can be used for each of the embodiments presented hereinbefore, that the so-called crossed electrode tuning fork solutions, in which pairs of excitation and detection electrodes are reversed between the two legs, are possible, without thereby departing from the invention defined by the annexed claims.

What is claimed is:

1. A transducer for measuring an angular velocity comprising:
    a single piezoelectric tuning fork that rotates at said angular velocity,
    said tuning fork including first and second vibrating legs extending from a base,
    means for exciting a first vibration of the tuning fork, arranged on one of the two legs, called the excitation leg, and
    means for detecting a second vibration of the tuning fork generated in response to said first vibration and to a rotation of the tuning fork, arranged on the other of the two legs, called the detection leg,
    wherein said detection leg has a cross-shaped section including two top lateral faces and two bottom lateral faces, said top and bottom faces being separated by protruding parts projecting with respect to said top and bottom faces, and
    wherein said detection means include first and second detection electrodes arranged facing each other, each being arranged on one of the top lateral faces such that the electrical field between the first and second detection electrodes is substantially rectilinear through the detection leg, and third and fourth detection electrodes arranged facing each other, each being arranged on one of the bottom lateral faces such that the electrical field between the third and fourth detection electrodes is substantially rectilinear through the detection leg.

2. The transducer for measuring an angular velocity according to claim 1, wherein said excitation leg has a cross-shaped section including two top lateral faces and two bottom lateral faces, said top and bottom faces being separated by first and second protruding parts projecting with respect to said top and bottom faces, and
wherein said excitation means include a first pair of excitation electrodes arranged respectively on the top and bottom of the excitation leg, respectively covering the top lateral faces and bottom lateral faces, and a second pair of excitation electrodes, each of the electrodes of said second pair being arranged over the thickness of one or the other protruding part of the excitation leg.

3. The transducer for measuring an angular velocity according to claim 1, wherein said excitation leg has a cross-shaped section including two top lateral faces and two bottom lateral faces, said top and bottom faces being separated by first and second protruding parts projecting with respect to said top and bottom faces, and
wherein said excitation means include a first pair of excitation electrodes arranged respectively on the top and bottom of the excitation leg, without covering the top lateral faces and bottom lateral faces, and a second pair of excitation electrodes, each of the electrodes of said second pair being arranged over the thickness of one or the other protruding part of the excitation leg as well as at least partially covering the top and bottom lateral faces arranged on either side of the first protruding part, respectively the top and bottom lateral faces arranged on either side of the second protruding part.

4. The transducer for measuring an angular velocity according to claim 1, wherein said cross-shaped section of the detection leg has a top face connecting the two top lateral faces and a bottom face connecting the two bottom lateral faces,
wherein said top and bottom faces each have at least one groove, said grooves having lateral flanks,
wherein at least one of the electrodes of said first pair of detection electrodes is arranged on one of the lateral flanks of said at least one groove, of the top face such that the electrical field between the two electrodes is substantially rectilinear through the detection leg, and
wherein at least one of the electrodes of the second pair of detection electrodes is arranged on one of the lateral flanks of said at least one groove of the bottom face such that the electrical field between the two electrodes is substantially rectilinear through the detection leg.

5. The transducer for measuring an angular velocity according to claim 4, wherein each of said top and bottom faces includes a single groove,
wherein said detection means further include a third pair of detection electrodes arranged facing each other, one of the electrodes of the third pair being arranged on the other lateral flank of said groove of the top face, the other of the electrodes of the third pair being arranged on the top lateral face such that the electrical field between the two electrodes is substantially rectilinear through the detection leg, and
wherein the detection means further include a fourth pair of detection electrodes arranged facing each other, one of the electrodes of said fourth pair being arranged on the other lateral flank of said groove, the other of the electrodes of said fourth pair being arranged on the bottom lateral face such that the electrical field between the two electrodes is substantially rectilinear through the detection leg.

6. The transducer for measuring an angular velocity according to claim 4, wherein each of the top and bottom faces includes two grooves,
wherein the detection means further include a third pair of electrodes arranged facing each other, one of the electrodes of said third pair being arranged on one lateral flank of the other of said grooves of the top face, the other of the electrodes of said third pair being arranged on the top lateral face such that the electrical field between the two electrodes is substantially rectilinear through the detection leg, and
wherein the detection means further include a fourth pair of detection electrodes arranged facing each other, one of the electrodes of said fourth pair being arranged on one of the lateral flanks of the other of the two grooves of the bottom face, the other of the electrodes of said fourth pair being arranged on the bottom lateral face such that the electrical field between the two electrodes is substantially rectilinear through the detection leg.

7. The transducer for measuring an angular velocity according to claim 1, wherein the piezoelectric tuning fork is a quartz whose top and bottom faces are substantially perpendicular to the optical axis (z) of the quartz and wherein the legs extend substantially along the mechanical axis (y) of the quartz.

8. The transducer for measuring an angular velocity according to claim 1, wherein the base is provided with mechanical uncoupling means between a part for securing the base and the legs of the tuning fork.

* * * * *